(12) United States Patent
Holden

(10) Patent No.: US 6,707,710 B1
(45) Date of Patent: Mar. 16, 2004

(54) MAGNETIC MEMORY DEVICE WITH LARGER REFERENCE CELL

(75) Inventor: Anthony Holden, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/318,520

(22) Filed: Dec. 12, 2002

(51) Int. Cl.$^7$ .................................................. G11C 11/00
(52) U.S. Cl. ....................... 365/158; 365/210; 365/171
(58) Field of Search .................................. 365/158, 210, 365/171, 173

(56) References Cited

U.S. PATENT DOCUMENTS

| 6,538,940 B1 | * | 3/2003 | Nahas et al. | 365/210 |
| 2002/0036919 A1 | * | 3/2002 | Daughton et al. | 365/171 |
| 2003/0031045 A1 | * | 2/2003 | Hosotani | 365/158 |

* cited by examiner

Primary Examiner—Huan Hoang

(57) ABSTRACT

Embodiments of the present invention provide a magnetic memory. In one embodiment, the magnetic memory comprises a memory cell configured to provide a resistive state, and a reference cell. The reference cell is substantially larger than the memory cell and configured to provide a reference resistance for determining the resistive state of the memory cell.

34 Claims, 3 Drawing Sheets

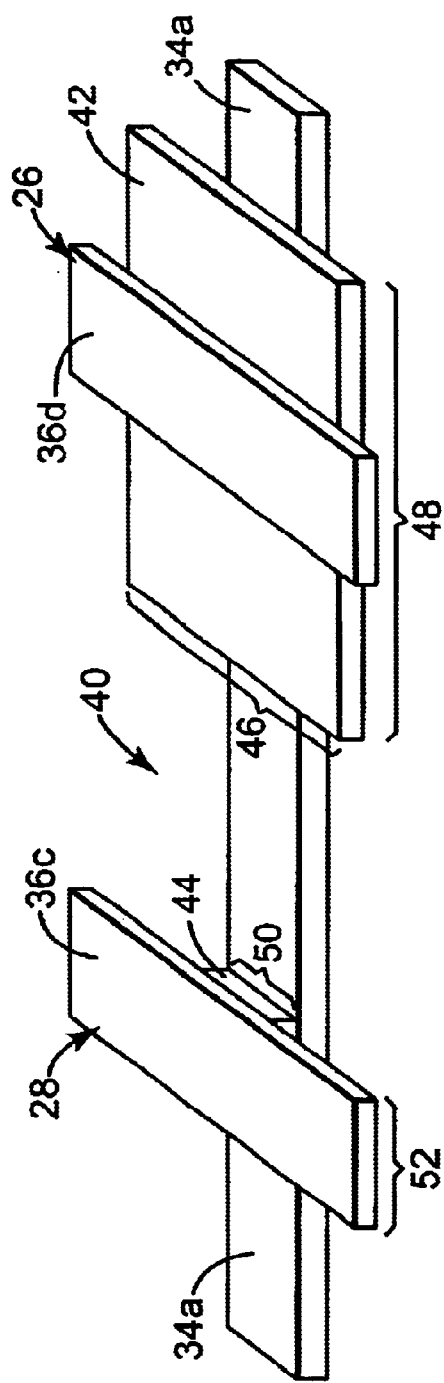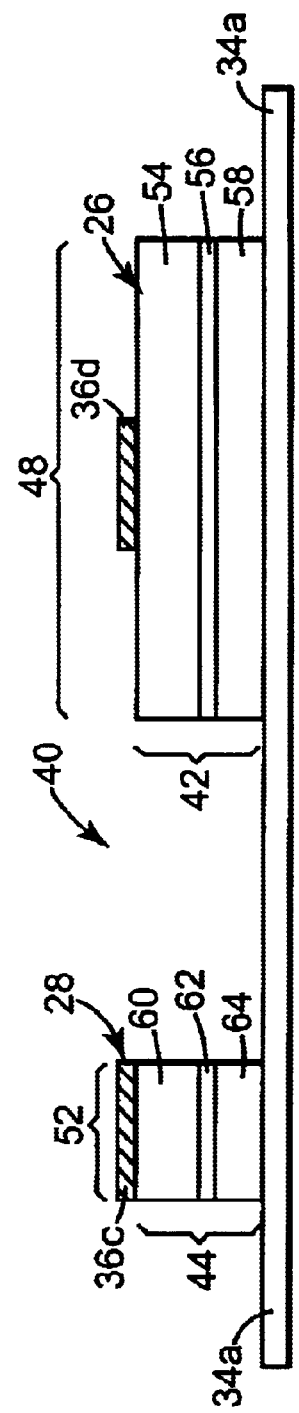

MAGNETIC MEMORY DEVICE WITH LARGER REFERENCE CELL

THE FIELD OF THE INVENTION

The present invention generally relates to non-volatile memory devices, and more particularly, to memory devices that use magnetic memory cells.

BACKGROUND OF THE INVENTION

One type of non-volatile memory known in the art relies on magnetic memory cells. These devices, known as magnetic random access memory (MRAM) devices, include an array of magnetic memory cells. The magnetic memory cells may be of different types. For example, a magnetic tunnel junction (MTJ) memory cell or a giant magnetoresistive (GMR) memory cell.

Generally, the magnetic memory cell includes a layer of magnetic film in which the orientation of magnetization is alterable and a layer of magnetic film in which the orientation of magnetization may be fixed or "pinned" in a particular direction The magnetic film having alterable magnetization is referred to as a sense layer or data storage layer and the magnetic film that is fixed is referred to as a reference layer or pinned layer. A barrier layer separates the sense layer and the reference layer.

Conductive traces referred to as word lines and bit lines are routed across the array of memory cells. Word lines extend along rows of the memory cells and bit lines extend along columns of the memory cells. A memory cell stores a bit of information as an orientation of magnetization in a sense layer at each intersection of a word line and a bit line. The orientation of magnetization in the sense layer aligns along an axis of the sense layer referred to as its easy axis. The orientation of magnetization does not easily change along an axis orthogonal to the easy axis, referred to as the hard axis. Magnetic fields are applied to flip the orientation of magnetization in the sense layer along its easy axis to either a parallel or anti-parallel orientation with respect to the orientation of magnetization in the reference layer.

Conductive traces referred to as write lines are routed across the array of memory cells to aid in flipping the orientation of magnetization in sense layers. Write lines extend along columns of memory cells near their reference layers and parallel to bit lines. Word lines, which extend along rows of the memory cells, are near the sense layers. A memory cell is situated at each intersection of a write line and a word line. The write lines and word lines are electrically coupled to a write circuit During a write operation, the write circuit selects one word line and one write line to change the orientation of magnetization in the sense layer of the memory cell situated at the conductors crossing point. The write circuit supplies write currents to the selected word line and write line to create magnetic fields in the selected memory cell. These write currents may be the same or different in magnitude. The magnetic fields combine to switch the orientation of magnetization in the selected memory cell from parallel to anti-parallel or vice versa.

The resistance through a memory cell differs according to the parallel or anti-parallel orientation of magnetization of the sense layer and the reference layer. This resistance is highest when the orientation is anti-parallel, i.e., the logic (1) state, and lowest when the orientation is parallel, i.e., the logic (0) state. The resistive logic state of the memory cell can be determined by sensing the resistance of the memory cell.

Word lines and bit lines aid in sensing the resistance of a memory cell. Word lines, which extend along rows, are electrically coupled to sense layers and bit lines, which extend along columns, are electrically coupled to reference layers. Word lines and bit lines are also electrically coupled to a read circuit to determine the resistance and state of a memory cell.

During a read operation, the read circuit selects one word line and one bit line to determine the resistance of the memory cell situated at the conductors crossing point. The read circuit may supply a voltage across the selected memory cell to generate a current through the memory cell. The read circuit detects this sense current, which represents the resistance of the memory cell. In one configuration, this resistance is compared to a reference resistance to determine the state of the memory cell. The reference resistance is used to differentiate a high resistive state from a low resistive state, which can be a challenging task.

The resistance through a memory cell vanes from cell to cell in the same array and from memory device to memory device. This resistance is dependent on barrier layer thickness and memory cell area. The barrier layer is a very thin insulating layer between the sense layer and the reference layer. This insulating layer may be aluminum oxide only Angstroms thick. The resistance of a memory cell varies exponentially with the thickness of the barrier layer. A change in barrier layer thickness of only two percent may change the resistance through the memory cell by a factor of two. Even with tight controls the resistance through memory cells in one device may greatly vary from the resistance through memory cells in another device. For this reason, using one resistance value for all devices is not practical. To get around this, memory cells have been converted to use as reference cells. These reference cells are used to get a reference resistance for a particular array or set of memory cells. However, the resistance through memory cells in the same array varies from cell to cell due to barrier layer thickness changes. Also, the resistance through a memory cell is dependent on memory cell area, and memory cell lengths and widths in the same array vary from cell to cell due to photolithography limitations. For these reasons, one memory cell resistance converted to a reference cell resistance may not be adequate for differentiating a high resistive state from a low resistive state.

SUMMARY OF THE INVENTION

Embodiments of the present invention provide a magnetic memory. In one embodiment, the magnetic memory comprises a memory cell configured to provide a resistive state, and a reference cell. The reference cell is substantially larger than the memory cell and configured to provide a reference resistance for determining the resistive state of the memory cell.

BRIEF DESCRIPTION OF THE DRAWINGS

Embodiments of the invention are better understood with reference to the following drawings. The elements of the drawings are not necessarily to scale relative to each other. Like reference numerals designate corresponding similar pants.

FIG. 2 is a perspective view illustrating one exemplary embodiment of an array section, according to the present invention.

FIG. 3 is a diagram illustrating a cross-section of the exemplary embodiment of the array section, according to the present invention.

DETAILED DESCRIPTION

Figure 1:
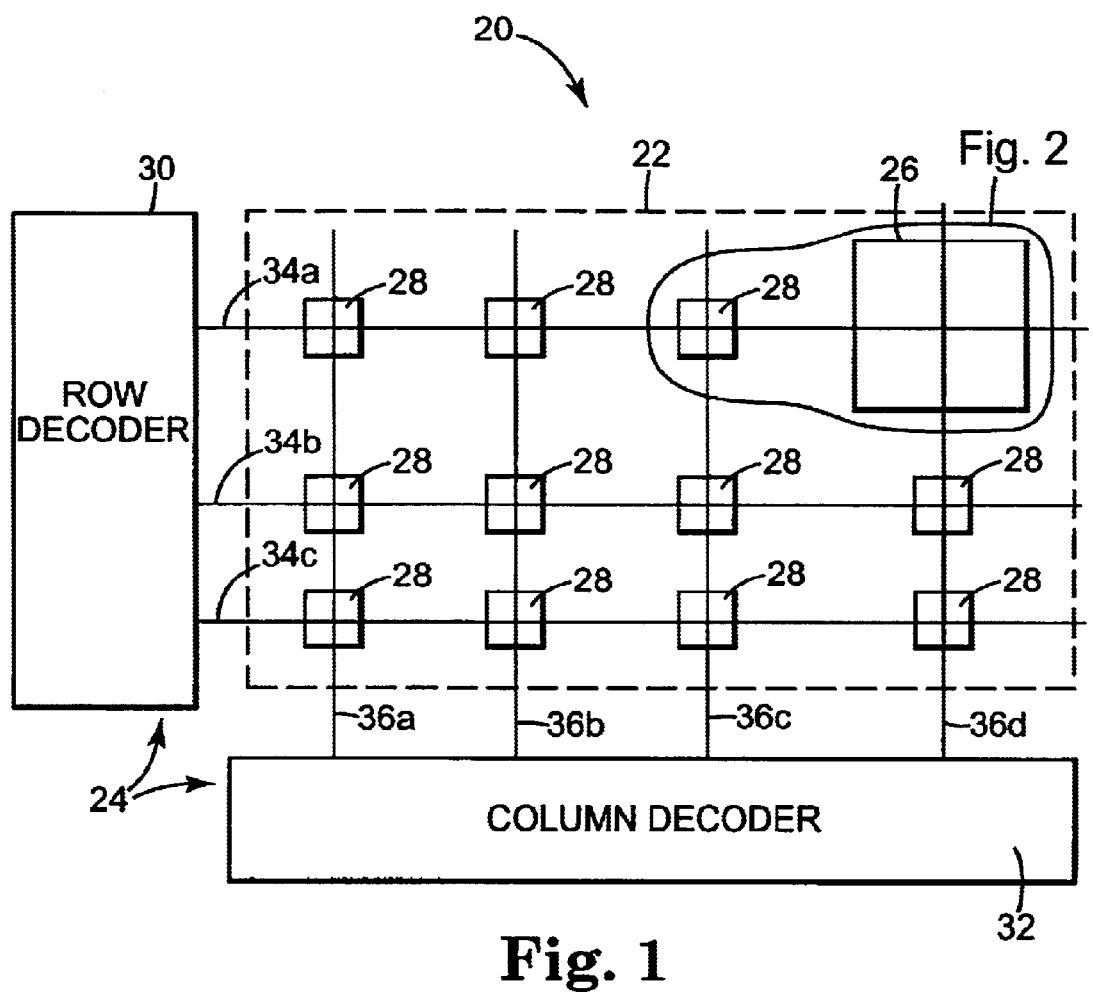
FIG. 1 is block diagram illustrating one exemplary embodiment of a magnetic memory device, according to the present invention.

FIG. 1 is a block diagram illustrating one exemplary embodiment of a magnetic memory device 20, according to the present invention. Magnetic memory device 20 includes a magnetic memory cell array 22 electrically coupled to a read circuit 24 and a write circuit (not shown for clarity). Array 22 includes a magnetic reference cell 26 and magnetic memory cells 28, arranged in rows and columns. Read circuit 24 includes a row decoder 30 and a column decoder and sensing circuit, indicated at 32. Row decoder 30 and column decoder 32 are electrically coupled to row and column read conductors that intersect at reference cell 26 and memory cells 28.

Reference cell 26 and memory cells 28 are manufactured during the same process and have generally the same barrier layer thickness. Reference cell 26 is substantially larger than each memory cell 28, and the resistance through reference cell 26 is proportional to the resistance through each memory cell 28. Due to its larger size, reference cell 26 includes variations in barrier layer thickness present in memory cells 28 across array 22. Reference cell 26 has an average barrier layer thickness about equal to the average barrier layer thickness for array 22. Also, the larger area of reference cell 26 is affected little by photolithography variations; this results in an accurate reference resistance from one device to another. For these reasons, the resistance through reference cell 26 is an accurate reference resistance that can be scaled to sense the state of each memory cell 28 in array 22.

During a read operation, read circuit 24 selects the row conductor and column conductor that intersect at reference cell 26. The resistance through reference cell 26 is characterized and a value representing the resistance is determined. This value is scaled as desired and stored as a threshold value. Next, read circuit 24 selects a row conductor and column conductor intersecting at a selected memory cell 28. The resistance through the selected memory cell 28 is characterized and checked against the threshold value to determine the resistive state or logic state (0 or 1) of the selected memory cell 28. During this read operation, the resistance through the selected memory cell 28 is characterized only once. Also, the threshold value may be used multiple times to determine the state of many memory cells 28. For these reasons, time and power are conserved.

Magnetic memory device 20 includes magnetic memory cell array 22 with magnetic reference cell 26 and a plurality of magnetic memory cells 28. The memory cells 28 are arranged in rows and columns, with rows extending along an x-direction and columns extending along a y-direction. One reference cell 26 is shown in the corner of array 22. In practice, more than one reference cell 26 may be used. Also, only a relatively small number of memory cells 28 are shown to simplify the illustration of the magnetic memory device 20. In practice, arrays of any size may be used.

Conductive traces functioning as word lines 34a–34c and bit lines 36a–36d extend across array 22. Word lines 34a–34c extend along the x-direction in a plane on one side of array 22 and bit lines 36a–36d extend along the y-direction in a plane on an opposing side of array 22. There is one word line 34a–34c for each row of array 22 and one bit line 36a–36d for each column of array 22. A memory cell 28 is located at each cross point of a word line 34a–34c and a bit line 36a–36d, except where reference cell 26 is located. In the present embodiment, reference cell 26 is located at the cross point of word line 34a and bit line 36d. However, in other embodiments reference cell 26 is located at a different word line 34a–34c and bit line 36a–36d cross point or reference cell 26 is located outside of array 22 at the cross point of read conductors that do not intersect any memory cells 28. Also, in other embodiments, array 22 includes multiple reference cells 26 positioned throughout array 22, for example, along one bit line 36d and at each cross point with word lines 34a–34c. Exemplary embodiments of magnetic memory device 20, according to the present invention, are described in detail later in this specification.

Read circuit 24 is electrically coupled to word lines 34a–34c and bit lines 36a–36d to read reference cell 26 and memory cells 28. Read circuit 24 includes row decoder 30 electrically coupled to word lines 34a–34c, and column decoder 32 electrically coupled to bit lines 36a–36d. Column decoder 32 is also referred to as column decoder and sensing circuit 32.

During a read operation, the resistance through a selected memory cell 28 is characterized and checked against a threshold value. The threshold value represents the characterized and scaled resistance of reference cell 26. The state of the selected memory cell 28 is determined from the result. Any number of circuits may be used to accomplish this read operation. In the present embodiment using one exemplary read circuit and method, row decoder 30 selects word line 34a and couples word line 34a to ground. Column decoder 32 selects bit line 36d and couples bit line 36d to a charge amplifier. An integrator capacitor, coupled to the other side of the charge amplifier is charged to a known voltage. The charge amplifier applies a fixed voltage to the selected bit line 36d. This causes a constant sense current to flow through reference cell 26. The constant sense current is a function of the resistance through reference cell 26. The sense current discharges the integrator capacitor, whose voltage level is compared to a reference voltage. A digital sense amplifier measures the time it takes to discharge the integrator capacitor to the reference voltage. This value is scaled and stored as the threshold value. In one embodiment the threshold value representing the reference resistance through reference cell 26 is scaled according to the difference in area between reference cell 26 and memory cells 28. Next, word line 34a is disconnected from ground and bit line 36d is disconnected from the charge amplifier.

To select a memory cell 28, row decoder 30 selects a word line 34a–34c and couples it to ground, and column decoder 32 selects a bit line 36a–36d and couples it to a charge amplifier. As with reference cell 26, the charge amplifier applies a fixed voltage to the selected bit line 36a–36d that results in a constant sense current flowing through the selected memory cell 28. This sense current, which is a function of the resistance through the selected memory cell 28, discharges an integrator capacitor. A digital sense amplifier measures the time it takes to discharge the integrator capacitor to a reference voltage and checks this value against the threshold value. The result determines the resistive state of the selected memory cell 28. During this operation, reference cell 26 supplies a proportional and accurate reference resistance for determining the threshold value.

A circuit and method suitable for accomplishing this read operation is described in U.S. Pat. No. 6,188,615, titled "MRAM Device Including Digital Sense Amplifiers," issued to Perner et al. on Feb. 13, 2001, the disclosure of which is incorporated herein by reference.

Memory device 20 also includes write conductors (not shown for clarity), which extend along the y direction in a plane on one side of array 22. These write conductors are electrically coupled to the write circuit for altering the orientation of magnetization in memory cells 28. Word lines 34a–34c, which extend along the x-direction on an opposing side of array 22, are also electrically coupled to the write circuit. A magnetic memory cell 28 is located at each cross point of a write conductor and a word line 34a–34c. The write conductors do not extend across reference cell 26 and the state of reference cell 26 is not altered.

During a write operation, the write circuit selects one write conductor and one word line 34a–34c to change the orientation of magnetization of the memory cell 28 located at the cross point. The write circuit supplies one write current to the selected write conductor and a second write current to the selected word line 34a–34c. These write currents create magnetic fields around the write conductor and word line 34a–34c, according to the right hand rule, to change the orientation of magnetization in the selected memory cell 28.

FIG. 2 is a diagram illustrating an exemplary embodiment of an array section, indicated at 40. Array section 40 includes magnetic reference cell 26 and one magnetic memory cell 28. Reference cell 26 includes word line 34a, bit line 36d and a reference cell stack 42. The reference cell stack 42 is positioned between word line 34a and bit line 36d. Memory cell 28 includes word line 34a, bit line 36c and memory cell stack 44. Memory cell stack 44 is positioned between word line 34a and bit line 36c. Word line 34a is illustrated as essentially orthogonal to bit lines 36c and 36d. However, word line 34a can lie in other angular relations to bit lines 36c and 36d.

Reference cell stack 42 is substantially larger than memory cell stack 44. Reference cell stack 42 has a length, indicated at 46, and a width, indicated at 48, where the area of reference cell stack 42 is equal to length 46 times width 48. Memory cell stack 44 has a length, indicated at 50, and a width, indicated at 52, where the area of memory cell stack 44 is equal to length 50 times width 52. The term substantially larger in this specification is defined as the area of reference cell stack 42 being substantially larger, which in one preferred embodiment is approximately at least two times greater than the area of memory cell stack 44, in any combination of lengths 46 and 50, and widths 48 and 52. In preferred embodiments of the present invention, length 46 is up to ten times longer than length 50; and/or width 48 is up to ten times wider than width 52. This results in the area of reference cell stack 42 being four times or more greater than the area of memory cell stack 44, in any combination of lengths 46 and 50, and widths 48 and 52. It will be appreciated that the relative dimensions of reference cell stack 42 and memory cell stack 44 are not limited to specific multiples given here and may extend beyond ten times longer and/or wider. Process limitations, which result in varying the barrier layer thickness, and the lengths and widths of stacks 42 and 44, have less effect on the larger reference cell stack 42. This makes the larger reference cell 42 suited for use in determining a comparison or threshold value.

FIG. 3 is a diagram illustrating a cross-section of the exemplary embodiment of array section 40. Array section 40 includes reference cell 26 and memory cell 28. Reference cell 26 includes reference cell stack 42 located between word line 34a and bit line 36d. Memory cell 28 includes memory cell stack 44 located between word line 34a and bit line 36c. In this exemplary embodiment, reference cell stack 42 includes a sense layer 54, a barrier layer 56 and a reference layer 58. Barrier layer 56 electrically couples sense layer 54 to reference layer 58. Memory cell stack 44 includes a sense layer 60, a barrier layer 62 and a reference layer 64. Barrier layer 62 electrically couples sense layer 60 to reference layer 64.

Reference cell stack 42 is substantially larger than memory cell stack 44. Similarly, barrier layer 56 is substantially larger than barrier layer 62, where substantially larger is at least approximately two times greater in area as previously defined. The resistance through reference cell 26 or memory cell 28 is exponentially dependent on the thickness of barrier layer 56 or 62, respectively. In the present embodiment, the barrier layer thickness is less than 20 angstroms and a two percent change in barrier layer thickness can vary resistance by a factor of two. Barrier layer thickness varies between memory cells 28 in array 22. However, the substantially larger barrier layer 56 includes variations in barrier layer thickness found in memory cells 28 across array 22. Barrier layer 56 has an average barrier layer thickness about equal to the average barrier layer thickness of array 22. Also, the larger area of barrier layer 56 is affected little by photolithography variations; this results in an accurate resistance from one device to another.

The resistance through reference cell 26 is used as a reference resistance to determine the state stored in memory cell 28. This reference resistance is proportional to the resistance through memory cell 28. To get a proportional reference resistance, reference cell 26 and memory cell 28 are produced during the same process. This results in reference cell stack 42 and memory cell stack 44 having a similar barrier layer thickness. To determine the state of memory cell 28, the reference resistance is scaled and checked against the resistance through the memory cell 28. The resistance through reference cell 26 is an accurate and proportional average reference resistance that can be scaled to sense the resistive state of each memory cell 28 in array 22.

During a read operation, using the exemplary read circuit as previously described, word line 34a is coupled to ground and bit line 36d is coupled to a charge amplifier. The charge amplifier applies a fixed voltage to the selected bit line 36d. This results in a constant sense current flowing through the reference cell stack 42 including the sense layer 54, barrier layer 56 and reference layer 58. This constant sense current is a function of the resistance through the reference cell stack 42. The sense current discharges an integrator capacitor, whose voltage level is compared to a reference voltage. A digital sense amplifier measures the time it takes to discharge the integrated capacitor to the reference voltage. This value is scaled and stored as a threshold value. Next, the charge amplifier is disconnected from bit line 36d and the same or a different charge amplifier is connected to bit line 36c to characterize the resistance through memory cell 28. As with reference cell 26, the charge amplifier applies a fixed voltage to the selected bit line 36c which results in a constant sense current flowing through memory cell stack 44, including the sense layer 60, barrier layer 62 and reference layer 64. This sense current, which is a function of the resistance through the memory cell 28, discharges an integrator capacitor. A digital sense amplifier measures the time it takes to discharge the integrator capacitor to a reference voltage and checks this value against the threshold value to determine the resistive state of memory cell 28. In one embodiment, the threshold value is scaled according to the area differences in the reference cell 26 and the memory cell 28. The memory cell 28 discharge time is counted away from this threshold value toward zero. The result ends up negative or positive, where a negative value indicates one logic state and a positive value indicates another logic state for the selected memory cell 28.

During a write operation, the write circuit passes write currents through word line 34a and a write conductor (not shown). The write conductor is located parallel to bit line 36c and separated from bit line 36c by an isolation layer (also not shown). The write currents pass through the word line 34a and write conductor to create magnetic fields according to the write hand rule in sense layer 60. These magnetic fields cooperate to alter the orientation of magnetization in the sense layer and switch the state of memory cell 28.

Figure 4:
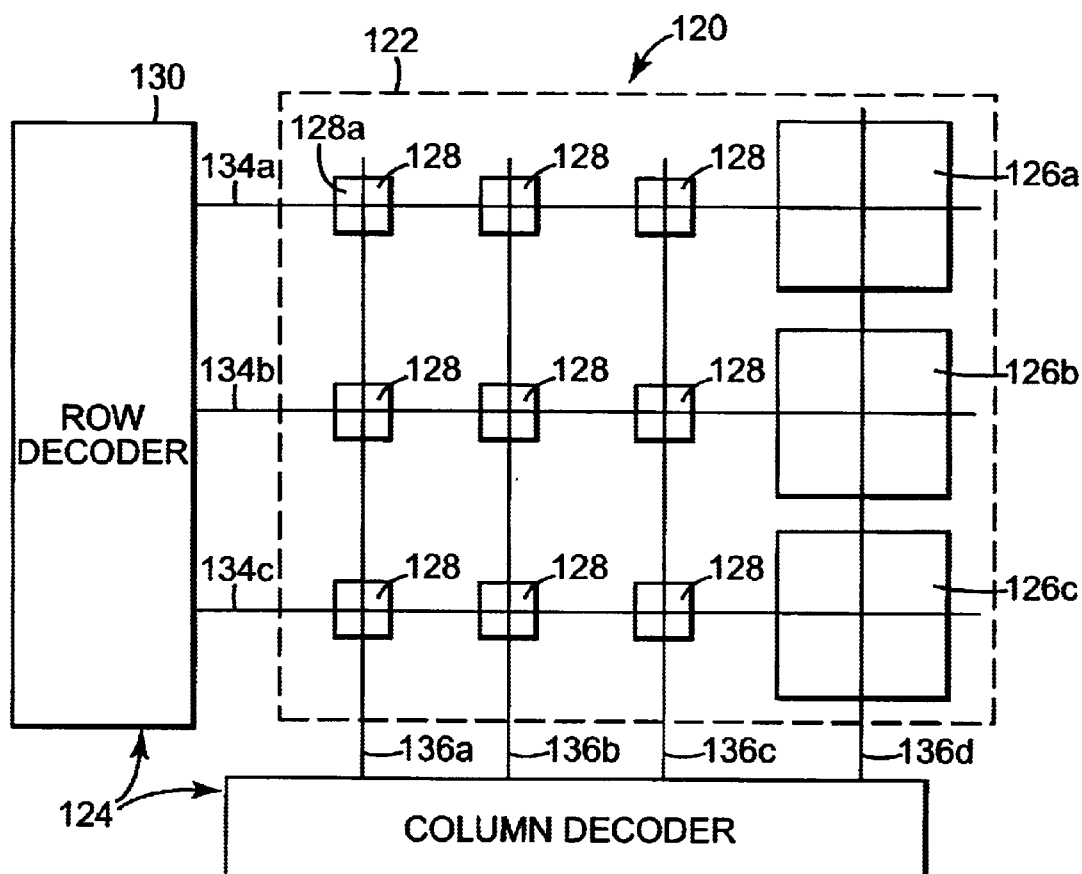
FIG. 4 is a block diagram illustrating another exemplary embodiment of a magnetic memory device, according to the present invention.

FIG. 4 is a block diagram illustrating an exemplary embodiment of a magnetic memory device 120, according to the present invention. Magnetic memory device 120 includes a magnetic memory cell array 122 electrically coupled to a read circuit 124 and a write circuit (not shown for clarity). Array 122 includes magnetic reference cells 126a–126c and magnetic memory cells, indicated generally at 128, arranged in rows and columns. Read circuit 124 includes a row decoder 130 and a column decoder, which includes a sense circuit, indicated at 132. Row decoder 130 and column decoder 132 are electrically coupled to row and column read conductors that intersect at reference cells 126a–126c and memory cells 128.

Memory device 120 includes memory cell array 122 having reference cells 126a–126c and a plurality of memory cells 128. Memory cells 128 are arranged in rows and columns, with the rows extending along an x-direction and the columns extending along a y-direction. Reference cells 126a–126c extend along one column of array 122. These reference cells 126a–126c are identical to reference cell 26 as illustrated in FIGS. 1–3 and previously described in this specification. Also, memory cells 128 are identical to memory cells 28 as illustrated in FIGS. 1–3 and previously described in this specification. Only a relatively small number of memory cells 128 and reference cells 126a–126c are shown to simplify the illustration of the memory device 120. In practice, arrays of any size may be used.

Conductive traces functioning as word lines 134a–134c and bit lines 136a–136d extend across array 122. Word lines 134a–134c extend along the x-direction in a plane on one side of array 122, and bit lines 136a–136d extend along the y-direction in a plane on an opposing side of array 122. There is one word line 134a–134c for each row of array 122, and one bit line 136a–136d for each column of array 122. A memory cell 128 is located at each cross point of a word line 134a–134c and a bit line 136a–136c. Reference cells 126a–126c are located at each cross point of a word line 134a134c with bit line 136d.

Read circuit 124 is electrically coupled to word lines 134a134c and bit lines 136a–136d for reading reference cells 126a–126c and memory cells 128. Read circuit 124 includes row decoder 130 electrically coupled to word lines 134a–134c, and column decoder 132 electrically coupled to bit lines 136a–136d. Column decoder 132 is also referred to as column decoder and sense circuit 132.

During a read operation, one reference cell 126a–126c and one memory cell 128 are selected simultaneously by read circuit 124 to determine the state of the selected memory cell 128. For example, row decoder 130 selects word line 134a and column decoder 132 selects bit lines 136a and 136d. This selects one memory cell, indicated more specifically at 128a, and one reference cell 126a along word line 134a. Bit lines 136a and 136d are coupled to the sense circuit in column decoder and sense circuit 132 to compare the resistance through reference cell 126a with selected memory cell 128a. The resistance values are scaled as desired with sense circuitry to accomplish a compare, which determines the state of selected memory cell 128a.

In the present embodiment, the resistance of reference cell 126a is compared differentially to the resistance through memory cell 128a. The resistance and resistive state of the selected memory cell 128a is sensed by read circuit 124, which includes a differential amplifier, a first current mode preamplifier coupled to a sense node of the differential amplifier, and a second current mode preamplifier coupled to a reference node of the differential amplifier. During a read operation, the first preamplifier applies a regulated voltage to the selected memory cell 128a, and the second preamplifier applies a regulated voltage to the selected reference cell 126a. A sense current flows through the selected memory cell 128a to the sense node of the differential amplifier, while a reference current flows through reference cell 126a to the reference node of the differential amplifier. This results in a differential voltage across sense and reference nodes. This differential voltage indicates whether a resistive state representing a logic value of "0" or "1" is stored in the selected memory cell 128a. Circuits and methods suitable for accomplishing this are described in U.S. Pat. No. 6,185,143, titled "Magnetic Random Access Memory (MRAM) Device Including Differential Sense Amplifiers," issued to Perner et al. on Feb. 6, 2001 the disclosure of which is hereby incorporated by reference. Other sensing circuits and methods, which could be used are described in U.S. Pat. No. 6,256,247, titled "Differential Sense Amplifiers For Resistive Cross Point Arrays," issued to Perner on Jul. 3, 2001, the disclosure of which is also hereby incorporated by reference.

Memory device 120 includes write conductors (not shown for clarity), which extend along the y-direction in a plane on one side of array 122. These write conductors are electrically coupled to the write circuit for altering the orientation of magnetization in memory cells 128. Word lines 134a–134c, which extend along the x-direction on an opposing side of array 122, are also electrically coupled to the write circuit. A memory cell 128 is located at each cross point of a write conductor and a word line 134a–134c. The write conductors do not cross reference cells 126a–126c and the state of reference cells 126a–126c are not altered.

During a write operation, the write circuit selects one write conductor and one word line 134a–134c to change the orientation of magnetization of the memory cell 128 located at the cross point. The write circuit supplies one write current to the selected write conductor and a second write current to the selected word line 134a–134c. These currents create magnetic fields around the write conductor and word line 134a–134c, according to the write hand rule. The magnetic fields cooperate to change the orientation of magnetization in the selected memory cell 128.

Figure 5:
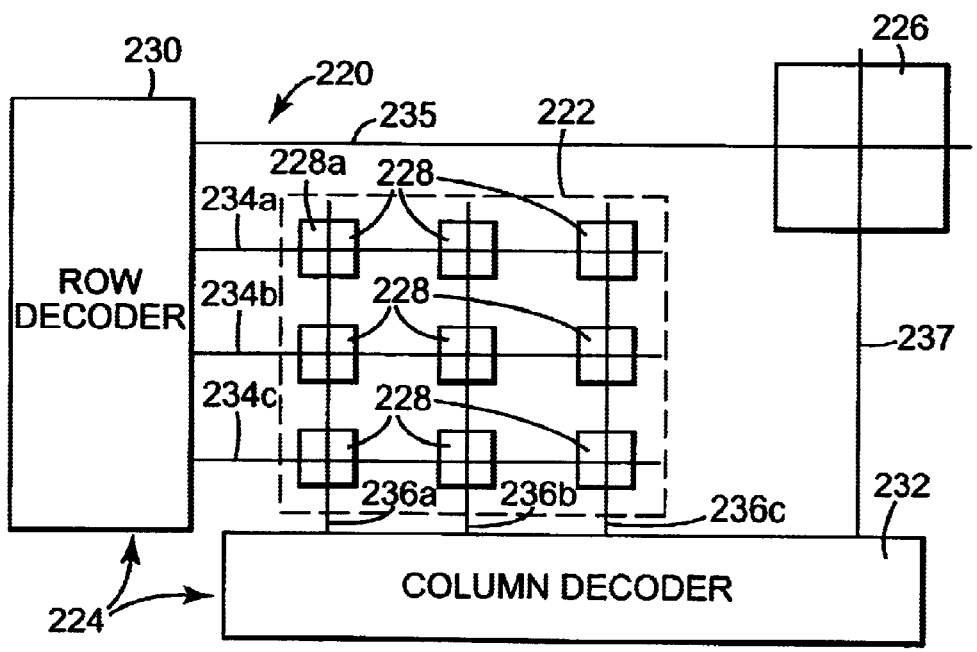
FIG. 5 is a block diagram illustrating a further exemplary embodiment of a magnetic memory device, according to the present invention.

FIG. 5 is a block diagram illustrating an exemplary embodiment of a magnetic memory device 220, according to the present invention. Magnetic memory device 220 includes a magnetic memory cell array 222 electrically coupled to a read circuit 224 and a write circuit (not shown for clarity). Memory device 220 also includes a magnetic reference cell 226 electrically coupled to read circuit 224. Array 222 includes magnetic memory cells, indicated generally at 228, arranged in rows and columns. Read circuit 224 includes a row decoder 230 and a column decoder, which includes a sense circuit, indicated at 232. Row decoder 230 and column decoder 232 are electrically coupled to row and column read conductors that intersect at the reference cell 226 and memory cells 228.

Memory device 220 includes reference cell 226 and array 222 having a plurality of memory cells 228. Memory cells 228 are arranged in rows and columns, with the rows extending along an x-direction and the columns extending a y-direction. Reference cell 226 is identical to reference cell 26 as illustrated in FIGS. 1–3 and previously described in this specification. Also, memory cells 228 are identical to memory cells 28 as illustrated in FIGS. 1–3 and previously described in this specification. Only a relatively small number of memory cells are shown to simplify the illustration of the magnetic memory device. In practice, arrays of any size may be used. Similarly, in practice more than one reference cell 226 may be used.

Conductive traces functioning as word lines 234a–234c and bit lines 236a–236c extend across array 222. Word lines 234a–234c extend along the x-direction in a plane on one side of array 222, and bit lines 236a–236c extend along the y-direction in a plane on an opposing side of array 222. There is one word line 234a–234c for each row of array 222, and one bit line 236a–236c for each column of array 222. A memory cell 228 is located at each cross point of a word line 234a–234c and a bit line 236a–236c. Conductive traces functioning as reference conductors 235 and 237 are electrically coupled to read circuit 224. Reference cell 226 is located at the cross point of reference conductors 235 and 237.

Read circuit 224 is electrically coupled to word lines 234a–234c and bit lines 236a–236c for reading memory cells 228. Read circuit 224 is also electrically coupled to reference conductors 235 and 237 for reading reference cell 226. Row decoder 230 is electrically coupled to word lines 234a–234c and reference conductor 235. Column decoder 232 is electrically coupled to bit lines 236a–236c and reference conductor 237. Column decoder 232 is also referred to as column decoder and sense circuit 232.

During a read operation, reference cell 226 and one memory cell 228 can be selected simultaneously to determine the state of the selected memory cell 228. For example, row decoder 230 selects word line 234a and reference conductor 235, and column decoder 232 selects bit line 236a and reference conductor 237. This selects reference cell 226 and the memory cell, indicated more specifically at 228a. Bit line 236a and reference conductor 237 are coupled to the sense circuit in column decoder and sense circuit 232 to compare the resistance through reference cell 226 with the resistance through memory cell 228a. The resistance values are scaled as desired with sense circuitry to accomplish a compare, which determines the resistive and logic state of selected memory cell 228a.

In the present embodiment, the reference resistance of reference cell 226 is compared differentially to the resistance through memory cell 228a. The resistance and state of the selected memory cell 228a is sensed by read circuit 224 including a differential amplifier, a first current mode preamplifier coupled to a sense node of the differential amplifier, and a second current mode preamplifier coupled to a reference node of the differential amplifier. During a read operation, the first preamplifier applies a regulated voltage to the selected memory cell 228a, and the second preamplifier applies a regulated voltage to the reference cell 226. A sense current flows through the selected memory cell 228a to the sense node of the differential amplifier, while a reference current flows through reference cell 226 to the reference node of the differential amplifier. This results in a differential voltage across sense and reference nodes. This differential voltage indicates whether a logic value of "0" or "1" is stored in the selected memory cell 228. Circuits and methods suitable for accomplishing this are described in the above-referenced U.S. Pat. No 6,185,143. Other sensing circuits and methods, which could be used, are described in the above-referenced U.S. Pat. No. 6,26,247.

Figure 6:
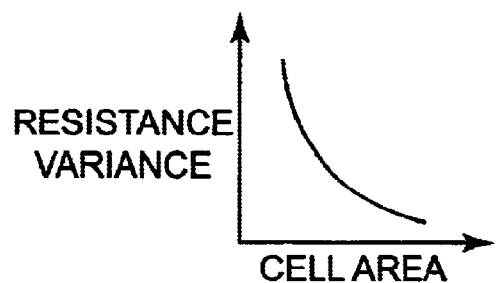
FIG. 6 is a graph illustrating resistance variance versus cell area for magnetic memory cells, which may be reference cells or memory cells in an array, according to the present invention.

FIG. 6 is a graph illustrating resistance variance versus cell area for magnetic memory cells, which may be reference cells or memory cells in an array. The resistance through magnetic memory cells in the same array varies due to variations in barrier layer thickness from cell to cell and to photolithography limitations. The resistance variance is a composite of these factors. As illustrated in FIG. 6, the resistance varies more for cells having a smaller area, and less for cells having a larger area. A small barrier layer area may have a large variation in barrier layer thickness. As area is increased, the larger area includes more variations in barrier layer thickness. These variations tend to average out in the larger area and the resistance variance due to barrier layer thickness decreases as cell area increases. Similarly, photolithography limitations have a larger effect on small cells. The length and width, and thus area, change a greater percentage for a smaller cell than a larger cell. This results in larger variations in resistance for smaller cells. Barrier layer thickness and photolithography limitations result in higher resistance variance for smaller cells and lower resistance variance for larger cells.

In embodiments of the present invention, the reference cell or cells are substantially larger than the memory cells. The reference cell is preferably produced with the memory cells and has generally the same barrier layer thickness. The resistance through the reference cell can be scaled to read the state of memory cells. The larger reference cell averages any variations in barrier layer thickness and reduces the effect of photolithography limitations. The increased size of the reference cell reduces the variance in resistance through the reference cell, to make it suitable for use as a reference resistance.

What is claimed is:

1. A magnetic memory, comprising:
    a memory cell configured to provide a resistive state; and
    a reference cell, where the reference cell is substantially larger than the memory cell and configured to provide a reference resistance for determining the resistive state of the memory cell.

2. The magnetic memory of claim 1, wherein the memory cell has a barrier layer and the reference cell has a barrier layer, where the memory cell barrier layer and the reference cell barrier layer are manufactured during the same process steps.

3. The magnetic memory of claim 1, wherein the memory cell has a barrier layer and the reference cell has a barrier layer, where the reference cell barrier layer is more than four times larger than the memory cell barrier layer.

4. The magnetic memory of claim 1, wherein the reference cell is more than four times larger than the memory cell.

5. The magnetic memory of claim 1, wherein the memory cell comprises a barrier layer having a thickness of less than 20 Angstroms.

6. The magnetic memory of claim 1, wherein the reference cell comprises a barrier layer having a thickness of less than 20 Angstroms.

7. The magnetic memory of claim 1, wherein the reference cell has a length and the memory cell has a length, where the reference cell length is between two times and ten times greater than the memory cell length.

8. The magnetic memory of claim 1, wherein the reference cell has a width and the memory cell has a width, where the reference cell width is between two times and ten times greater than the memory cell width.

9. The magnetic memory of claim 1, wherein the reference cell has a length and a width and the reference cell length is equal to the reference cell width.

10. The magnetic memory of claim 1, wherein the reference cell and the memory cell are sequentially accessed for determining the resistive state of the memory cell.

11. The magnetic memory of claim 1, wherein the reference cell and the memory cell are simultaneously accessed for determining the resistive state of the memory cell.

12. A magnetic memory, comprising:
an array of memory cells, where a selected memory cell in the array of memory cells is configured to provide a resistive state; and
a reference cell, where the reference cell is substantially larger than the selected memory cell and configured to provide a reference resistance for determining the resistive state of the selected memory cell.

13. The magnetic memory of claim 12, wherein the selected memory cell has a barrier layer and the reference cell has a barrier layer, where the selected memory cell barrier layer and the reference cell barrier layer are manufactured during the same process steps.

14. The magnetic memory of claim 12, wherein the selected memory cell has a barrier layer and the reference cell has a barrier layer, where the reference cell barrier layer is more than four times larger than the selected memory cell barrier layer.

15. The magnetic memory of claim 12, wherein the reference cell is more than four times larger than the selected memory cell.

16. The magnetic memory of claim 12, wherein the selected memory cell comprises a barrier layer having a thickness of less than 20 Angstroms.

17. The magnetic memory of claim 12, wherein the reference cell comprises a barrier layer having a thickness of less than 20 Angstroms.

18. The magnetic memory of claim 12, wherein the reference cell has a length and a width and the selected memory cell has a length and a width, where the reference cell length is between two times and ten times greater than the selected memory cell length.

19. The magnetic memory of claim 12, wherein the reference cell has a length and a width and the selected memory cell has a length and a width, where the reference cell width is between two times and ten times greater than the selected memory cell width.

20. The magnetic memory of claim 12, wherein the reference cell and the selected memory cell are accessed sequentially to determine the resistive state of the selected memory cell.

21. The magnetic memory of claim 12, wherein the reference cell and the selected memory cell are simultaneously accessed to determine the resistive state of the selected memory cell.

22. The magnetic memory of claim 12, further comprising a plurality of reference cells.

23. The magnetic memory of claim 12, wherein the reference cell is in the array of magnetic memory cells.

24. The magnetic memory of claim 12, wherein the reference cell is on the periphery of the array of memory cells.

25. The magnetic memory of claim 12, wherein the reference cell is independent of the array of memory cells.

26. A method to determine a resistive state of a magnetic memory cell, comprising:
characterizing a reference resistance through a reference cell that is substantially larger than the magnetic memory cell;
characterizing the resistive state of the magnetic memory cell; and
checking the characterized resistive state against the characterized reference resistance to determine the resistive state of the magnetic memory cell.

27. The method of claim 26, wherein characterizing the reference resistance, comprises:
providing a reference current through the reference cell to discharge an integrator capacitor to a reference voltage;
measuring the time it takes to discharge the integrator capacitor to the reference voltage; and
storing a threshold value proportional to the measured time.

28. The method of claim 27, wherein checking the characterized resistive state against the characterized reference resistance, comprises:
decrementing the threshold value while counting how long it takes to discharge an integrator capacitor to a reference voltage for characterizing the resistive state;
providing a first result if the resulting decremented threshold value is positive; and
providing a second result if the resulting decremented threshold value is negative.

29. The method of claim 27, wherein checking the characterized resistive state against the characterized reference resistance, comprises comparing the threshold value against time counted while characterizing the resistive state.

30. The method of claim 26, wherein characterizing the resistive state, comprises:
providing a memory cell current through the magnetic memory cell to discharge an integrator capacitor to a reference voltage; and
counting the time it takes to discharge the integrator capacitor to the reference voltage.

31. The method of claim 26, wherein characterizing the reference resistance and characterizing the resistive state are sequentially performed.

32. The method of claim 26, wherein characterizing the reference resistance and characterizing the resistive state are simultaneously performed.

33. The method of claim 26, wherein characterizing the reference resistance, comprises:
providing a reference voltage across the reference cell to create a reference current; and
sensing the reference current as a reference voltage at an input of a differential amplifier.

34. The method of claim 26, wherein characterizing the resistive state, comprises:
providing a memory cell voltage across the magnetic memory cell to create a memory cell current; and
sensing the memory cell current as a memory cell voltage at an input of the differential amplifier.

* * * * *